(12) United States Patent
Koch et al.

(10) Patent No.: US 7,550,744 B1
(45) Date of Patent: Jun. 23, 2009

(54) CHAMBERLESS SUBSTRATE HANDLING

(75) Inventors: George R. Koch, Los Altos, CA (US);
Douglas K. Masnaghetti, San Jose, CA (US)

(73) Assignee: KLA-Tencor Corporation, Milpitas, CA (US)

(*) Notice: Subject to any disclaimer, the term of this patent is extended or adjusted under 35 U.S.C. 154(b) by 353 days.

(21) Appl. No.: 11/690,454

(22) Filed: Mar. 23, 2007

(51) Int. Cl.
*H02K 41/00* (2006.01)
*H01J 37/18* (2006.01)

(52) U.S. Cl. .............. 250/440.11; 250/441.11; 250/442.11; 250/310

(58) Field of Classification Search ............ None
See application file for complete search history.

(56) References Cited

U.S. PATENT DOCUMENTS

| | | | |
|---|---|---|---|
| 4,524,261 A | 6/1985 | Petric | |
| 4,528,451 A | 7/1985 | Petric | |
| 4,560,880 A | 12/1985 | Petric | |
| 4,584,479 A | 4/1986 | Lamattina | |
| 4,607,167 A | 8/1986 | Petric | |
| 4,818,838 A | 4/1989 | Young | |
| 4,837,443 A | 6/1989 | Young | |
| 4,956,024 A | 9/1990 | Dean | |
| 6,710,354 B1* | 3/2004 | Koch et al. | 250/441.11 |
| 6,967,335 B1* | 11/2005 | Dyer et al. | 250/442.11 |
| 7,211,461 B2* | 5/2007 | Sakata et al. | 438/69 |
| 7,239,608 B2* | 7/2007 | Sreejith et al. | 370/230 |
| 7,288,774 B1* | 10/2007 | Koch et al. | 250/441.11 |
| 7,288,859 B2* | 10/2007 | Hazelton | 310/12 |
| 7,330,021 B2* | 2/2008 | Kurita et al. | 324/100 |
| 7,375,328 B2* | 5/2008 | Yonezawa et al. | 250/310 |
| 7,411,191 B2* | 8/2008 | Nakasuji et al. | 250/310 |
| 7,509,734 B2* | 3/2009 | Memmen et al. | 29/889.1 |
| 2009/0059190 A1* | 3/2009 | Tanaka et al. | 355/30 |
| 2009/0078374 A1* | 3/2009 | Bluck et al. | 156/345.32 |
| 2009/0098710 A1* | 4/2009 | Yamazaki | 438/458 |

* cited by examiner

*Primary Examiner*—David A. Vanore
(74) *Attorney, Agent, or Firm*—Luedeka, Neely & Graham, P.C.

(57) ABSTRACT without substantially touching the surface, having annular rings forming annular orifices, one of the rings forming an air bearing portion and having passages through which a flow of a gas can be established in a first direction, where the flow of the gas is sufficient to create a cushion of air between the puck and the surface, and at least some of the orifices for drawing vacuums through the orifices in a second direction opposite to the first direction against the surface.

20 Claims, 2 Drawing Sheets

CHAMBERLESS SUBSTRATE HANDLING

FIELD

This invention relates to the field of substrate handling. More particularly, this invention relates to presenting a substrate for inspection by a system, such as a charged particle beam inspection system, without the use of a vacuum chamber that encloses the substrate on a stage.

BACKGROUND

Particle beam systems, such as scanning electron microscopes, are typically used during integrated circuit fabrication for a variety of purposes. Some particle beam systems are used for etching layers of material on the substrates on which the integrated circuits are formed, others are used for depositing material onto the surface of the substrate, and others still—such as scanning electron microscopes—are used for inspection of the integrated circuits.

Particle beam systems typically operate by accelerating a charged species, such as an electron, positron, or proton, toward a target of some sort. In the example of an electron microscope, electrons are accelerated toward an inspection sample, and detection of the resultant scattering of secondary electrons is used to resolve images of the sample, or to determine the chemical composition of the sample.

Particle beam systems make use of a low pressure, or high vacuum, area that is formed around the sample. The high vacuum area is typically formed within a chamber that encompasses both the sample itself, and a movable stage upon which the sample resides. The high vacuum environment is important for the proper operation of the particle beam system. Further, the ability to move the sample, such as on the movable stage, also tends to be important to the convenient operation of the system.

However, providing a vacuum chamber of a sufficient size to contain the entire sample and movable stage adds cost, complexity, and size to the particle beam system.

What is needed, therefore, is a system that overcomes problems such as those described above, at least in part.

SUMMARY

The above and other needs are met by a vacuum seal air bearing puck for establishing a vacuum seal against a surface without substantially touching the surface, having annular rings forming annular orifices, one of the rings forming an air bearing portion and having passages through which a flow of a gas can be established in a first direction, where the flow of the gas is sufficient to create a cushion of air between the puck and the surface, and at least some of the orifices for drawing vacuums through the orifices in a second direction opposite to the first direction against the surface.

In various embodiments according to this aspect of the invention, first ends of the rings are disposed in a planar configuration, so as to receive a flat portion of the surface. In some embodiments the annular orifices include an inner orifice that is disposed in a center radial position to all of the rings and the other orifices. The puck has an outer radius of about one inch in some embodiments, and an inner orifice with a radius of about two millimeters. In some embodiments the passages are machined channels, but the passages may also be formed by a porous material from which the one of the rings is formed. In one embodiment the rings form a relatively smaller radius at a first end of the chuck, and the rings form a relatively larger radius at a second end of the chuck, while in another embodiment the rings of the puck are all disposed in a substantially parallel orientation one to another.

According to another aspect of the invention there is described a method for establishing a vacuum seal between a first element and a surface without substantially touching the surface, by providing a puck having annular rings forming annular orifices, forming an air bearing effect through one of the rings by establishing a flow of a gas through the one ring in a first direction, where the flow of the gas is sufficient to create a cushion of air between the puck and the surface, and drawing vacuums through at least one of the orifices in a second direction opposite to the first direction against the surface, where the vacuums are progressively higher in the orifices in a radially interior direction within the puck.

In various embodiments according to this aspect of the invention, the annular orifices formed include an inner orifice that is disposed in a center radial position to all of the rings and the other orifices, having a pressure of no more than about one torr. In some embodiments the air bearing effect is sufficient to bear a load of about five pounds in addition to a load created by drawing the vacuums.

According to yet another aspect of the invention there is described a particle beam system having a particle beam source, a motion stage for receiving and moving a substrate relative to the particle beam source, and a vacuum seal air bearing puck disposed between the particle beam source and the motion stage for establishing a vacuum seal against the substrate without substantially touching the substrate. The puck has annular rings forming annular orifices, one of the rings forming an air bearing portion and having passages through which a flow of a gas can be established toward the substrate, where the flow of the gas is sufficient to create a cushion of air between the puck and the substrate, and at least some of the orifices for drawing vacuums through the orifices between the puck and the surface.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
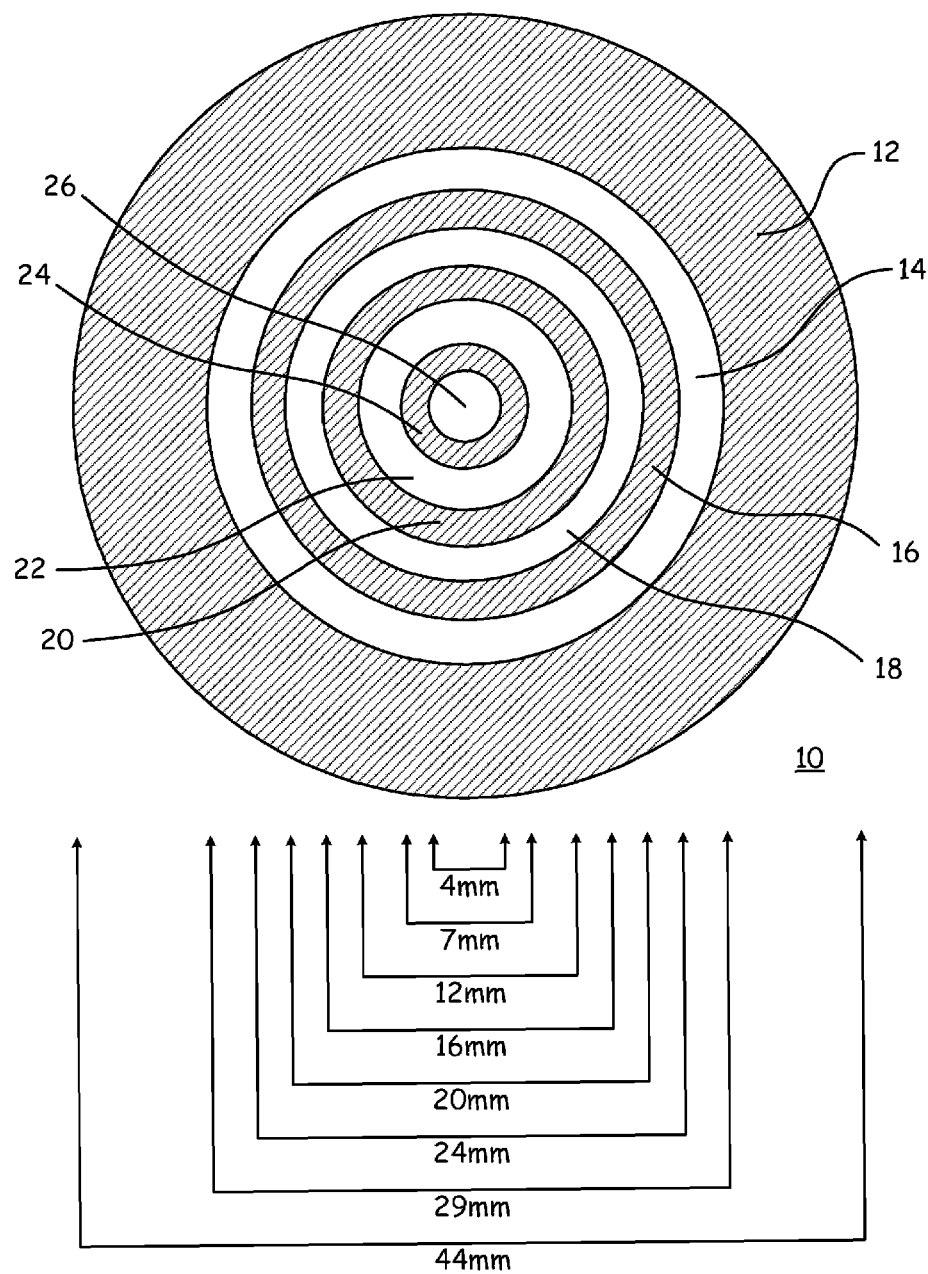
FIG. 1 is a horizontal cross sectional depiction of a micro seal air bearing according to a first embodiment of the present invention.
Figure 2:
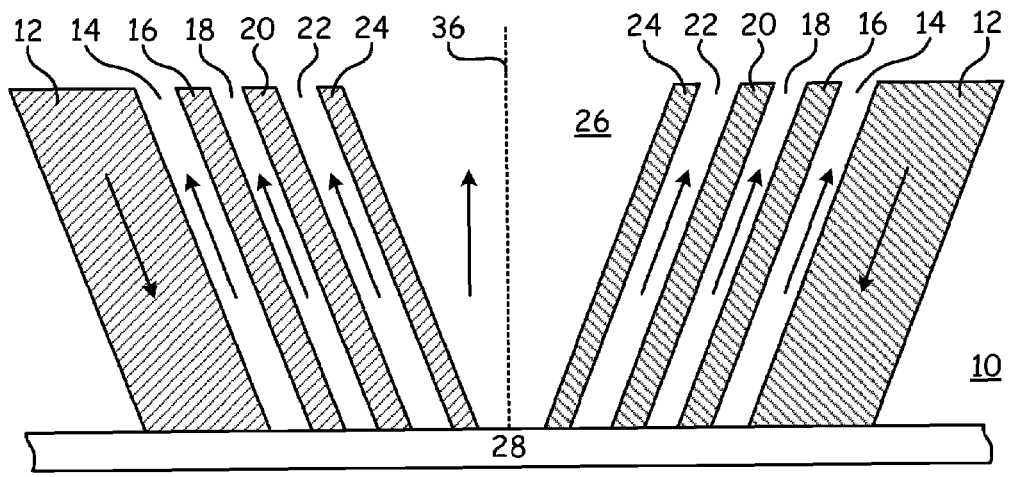
FIG. 2 is a vertical cross sectional depiction of a micro seal air bearing according to a second embodiment of the present invention.
Figure 3:
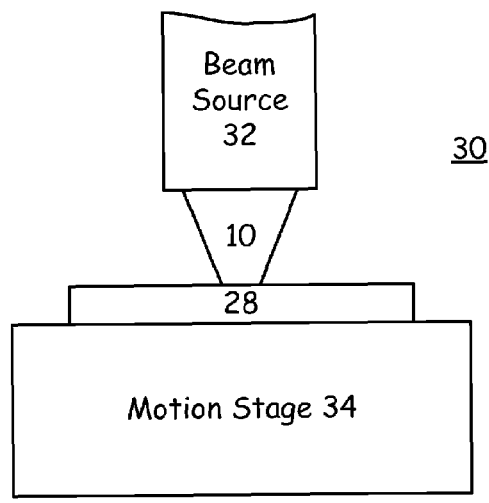
FIG. 3 is a functional block diagram of a particle beam system according to an embodiment of the present invention.

With reference now to FIGS. 1-3, there is depicted a micro seal air bearing 10, also called a puck 10 herein, which forms a vacuum seal against the surface of an object to be contacted by the particle beam system 30, such as a substrate 28 that is to be viewed with a scanning electron beam 36. In FIG. 1, the view is from one end or the other of the puck 10, looking down along and through the puck 10. In FIG. 2, the view is cross-sectional, depicting how the puck 10 contacts the substrate 28, or other element to which the particle beam 32 is applied (as depicted in FIG. 3).

The puck 10 is formed of annular rings 12, 16, 20, and 24 of a durable material, having properties as indicated hereafter, between which rings 12, 16, 20, and 24 are disposed annular orifices 14, 18, 22, and 26. In one embodiment, ring 12 functions as an air bearing. In this embodiment, ring 12 is formed of a porous material through which a flow of a gas, such as air, nitrogen, or argon, is established, where the flow and pressure of the gas are sufficient to create an air bearing effect between the puck 10 and the surface upon which it is applied. Thus, the flow is established in a direction toward the substrate 28, as depicted in FIG. 2. Through orifices 14, 18, 22, and 26 flows creating vacuums of different degrees are drawn, in a direction away from the substrate 29, as depicted in FIG. 2, preferably in a manner such as to create a high vacuum within the inner orifice 26, through which the particle beam 36 is directed toward the substrate 28.

For example, in one embodiment air from the air bearing portion 12 is returned up through orifice 14, a roughing pump is connected to draw a vacuum through orifice 18, a first stage turbomolecular pump is connected to draw a higher vacuum through orifice 22, and a second stage turbomolecular pump is connected to draw yet a higher vacuum through orifice 26. In this manner, the pressure within the inner orifice 26 is preferably sufficiently low so as to sustain a particle beam 36 having the desired properties, and also to protect the beam source 32. In one embodiment, the desired pressure for the inner orifice 26 is no more than about fifty microtorr, and in another embodiment, the inner orifice 26 is not more than about one torr.

In this manner, the puck 10 acts as an air bearing that can glide along the surface of the substrate 28 without damaging the substrate 28, such as by flying at approximately fifteen microns above the surface of the substrate 28. However, the puck 10 also acts as a seal for the high vacuum area within orifice 26. In this manner, a seal is formed such that neither the entire substrate 28 nor the motion stage 34 need be contained entirely within the high vacuum environment within the orifice 26. However, in some embodiments the puck 10 could be sized such that the entire substrate 28 and the motion stage 34 are either partially or entirely contained within the orifice 26.

The embodiment of the puck 10 in FIG. 1 has rings 12, 16, 20, and 24 that are generally perpendicular to the plane of the substrate 28, while the embodiment of the puck 10 in Fig. has rings 12, 16, 20, and 24 that are generally disposed at an angle to the plane of the substrate 28. In one embodiment, disposing the rings 12, 16, 20, and 24 such that the ends of the rings 12, 16, 20, and 24 that contact the substrate 28 form a smaller diameter circle than do the tops of the rings 12, 16, 20, and 24 is particularly beneficial. In that embodiment, there is a generally smaller exclusion area of the substrate 28 that underlies the puck 10, and which is generally inaccessible to the beam 36, while there is greater space at the top of the puck 10 within the inner orifice 26. However, in other embodiments the puck 10 can be moved off of the edge of the substrate 28, in which embodiments the issue of an exclusion area is generally moot.

FIG. 1 depicts some approximate feature sizes of the puck 10. It is appreciated that puck 10 as depicted in FIG. 1 is not to scale, and thus highly specific relative feature sizes of the puck 10 should not be inferred. However, in the embodiment depicted, the puck 10 is about two inches in diameter, and the inner orifice 26 is about four millimeters in diameter. In such an embodiment, providing a gas flow through the air bearing portion 12 of the puck 10 at a pressure of about sixty pounds per square inch would enable the puck 10 to bear a load of about five pounds, in addition to the effective weight load created by the vacuums drawn within the orifices 14, 18, 22, and 26.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A vacuum seal air bearing puck for establishing a vacuum seal against a surface without substantially touching the surface, the puck comprising:
    annular rings forming annular orifices,
    one of the rings forming an air bearing portion and having passages through which a flow of a gas can be established in a first direction, where the flow of the gas is sufficient to create a cushion of air between the puck and the surface, and
    at least some of the orifices for drawing vacuums through the orifices in a second direction opposite to the first direction against the surface wherein the annular rings and annular orifices of the puck establish a gas flow such that when the surface is sealed against the puck, a vacuum state is maintained between the puck and the surface without substantially touching the surface, and the puck and the surface are not enclosed within a vacuum chamber.

2. The puck of claim 1, wherein first ends of the rings are disposed in a planar configuration, so as to receive a flat portion of the surface.

3. The puck of claim 1, wherein the annular orifices include an inner orifice that is disposed in a center radial position to all of the rings and the other orifices.

4. The puck of claim 1, wherein the puck has an outer radius of about one inch.

5. The puck of claim 1, wherein the puck has an inner orifice with a radius of about two millimeters.

6. The puck of claim 1, wherein the passages are machined channels.

7. The puck of claim 1, wherein the passages are formed by a porous material from which the one of the rings is formed.

8. The puck of claim 1, wherein the rings form a relatively smaller radius at a first end of the puck, and the rings form a relatively larger radius at a second end of the puck.

9. The puck of claim 1, wherein the rings of the puck are all disposed in a substantially parallel orientation one to another.

10. A method for establishing a vacuum seal between a first element and a surface without substantially touching the surface, the method comprising the steps of:
    providing a puck having annular rings forming annular orifices,
    forming an air bearing effect through one of the rings by establishing a flow of a gas through the one ring in a first direction, where the flow of the gas is sufficient to create a cushion of air between the puck and the surface, and
    drawing vacuums through at least one of the orifices in a second direction opposite to the first direction against the surface, where the vacuums are progressively higher in the orifices in a radially interior direction within the puck.

11. The method of claim 10, wherein the annular orifices formed include an inner orifice that is disposed in a center radial position to all of the rings and the other orifices, having a pressure of no more than about one torr.

12. The method of claim 10, wherein the air bearing effect is sufficient to bear a load of about five pounds in addition to a load created by drawing the vacuums.

13. A particle beam system, comprising:
a particle beam source,
a motion stage for receiving and moving a substrate relative to the particle beam source, and
a vacuum seal air bearing puck disposed between the particle beam source and the motion stage for establishing a vacuum seal against the substrate without substantially touching the substrate, the puck having,
annular rings forming annular orifices,
one of the rings forming an air bearing portion and having passages through which a flow of a gas can be established toward the substrate, where the flow of the gas is sufficient to create a cushion of air between the puck and the substrate, and
at least some of the orifices for drawing vacuums through the orifices between the puck and the surface wherein the annular rings and annular orifices of the puck establish a gas flow such that when the substrate is sealed against the puck, a vacuum state is maintained on the substrate without substantially touching the substrate, and the puck and substrate are not enclosed within a vacuum chamber.

14. The system of claim 13, wherein the annular orifices include an inner orifice that is disposed in a center radial position to all of the rings and the other orifices, and through which the beam source establishes a particle beam.

15. The system of claim 13, wherein the puck has an outer radius of about one inch.

16. The system of claim 13, wherein the puck has an inner orifice with a radius of about two millimeters.

17. The system of claim 13, wherein the passages are machined channels.

18. The system of claim 13, wherein the passages are formed by a porous material from which the one of the rings is formed.

19. The system of claim 13, wherein the rings form a relatively smaller radius at a first end of the puck, and the rings form a relatively larger radius at a second end of the puck.

20. The system of claim 13, wherein the rings of the puck are all disposed in a substantially parallel orientation one to another.

* * * * *